(12) United States Patent
Miyakura et al.

(10) Patent No.: US 10,529,560 B2
(45) Date of Patent: Jan. 7, 2020

(54) METHOD OF MANUFACTURING SEMICONDUCTOR DEVICE, SUBSTRATE PROCESSING APPARATUS AND RECORDING MEDIUM

(71) Applicant: HITACHI KOKUSAI ELECTRIC INC., Tokyo (JP)

(72) Inventors: Takahiro Miyakura, Toyama (JP); Atsushi Moriya, Toyama (JP); Naoharu Nakaiso, Toyama (JP); Kensuke Haga, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/926,509

(22) Filed: Mar. 20, 2018

(65) Prior Publication Data
US 2018/0277364 A1 Sep. 27, 2018

(30) Foreign Application Priority Data

Mar. 22, 2017 (JP) .................................. 2017-056142

(51) Int. Cl.
  *H01L 21/02* (2006.01)
  *H01L 21/67* (2006.01)
  (Continued)

(52) U.S. Cl.
  CPC .... *H01L 21/02532* (2013.01); *H01L 21/0206* (2013.01); *H01L 21/0257* (2013.01); *H01L 21/0262* (2013.01); *H01L 21/02381* (2013.01); *H01L 21/02576* (2013.01); *H01L 21/02579* (2013.01); *H01L 21/02639* (2013.01);
  (Continued)

(58) Field of Classification Search
CPC combination set(s) only.
See application file for complete search history.

(56) References Cited

U.S. PATENT DOCUMENTS

2003/0139012 A1   7/2003   Yamauchi et al.
2007/0287272 A1  12/2007   Bauer et al.
(Continued)

FOREIGN PATENT DOCUMENTS

JP   09-129582 A   5/1997
JP   2003-218036 A   7/2003
(Continued)

OTHER PUBLICATIONS

Singaporean Written Opinion dated Apr. 15, 2019 for the Singaporean Patent Application No. 10201802150Y.
(Continued)

*Primary Examiner* — Ratisha Mehta
(74) *Attorney, Agent, or Firm* — Volpe and Koenig, P.C.

(57) ABSTRACT

There is provided a technique that includes (a) pre-etching a surface of a substrate made of single crystal silicon by supplying a first etching gas to the substrate; (b) forming a silicon film on the substrate with the pre-etched surface, by supplying a first silicon-containing gas to the substrate; (c) etching a portion of the silicon film by supplying a second etching gas, which has a different molecular structure from a molecular structure of the first etching gas, to the substrate; and (d) forming an additional silicon film on the etched silicon film by supplying a second silicon-containing gas to the substrate.

20 Claims, 7 Drawing Sheets

(51) Int. Cl.
*H01L 21/306* (2006.01)
*H01L 21/3065* (2006.01)
*H01L 21/3213* (2006.01)

(52) U.S. Cl.
CPC .... *H01L 21/3065* (2013.01); *H01L 21/30604* (2013.01); *H01L 21/32135* (2013.01); *H01L 21/67069* (2013.01); *H01L 21/67109* (2013.01); *H01L 21/67248* (2013.01); *H01L 21/02592* (2013.01); *H01L 21/02595* (2013.01)

(56) References Cited

U.S. PATENT DOCUMENTS

| | | | |
|---|---|---|---|
| 2009/0093094 | A1 | 4/2009 | Ye et al. |
| 2009/0104740 | A1 | 4/2009 | Inokuchi et al. |
| 2009/0253265 | A1 | 10/2009 | Inokuchi et al. |
| 2009/0263971 | A1 | 10/2009 | Tanabe |
| 2014/0199824 | A1 | 7/2014 | Komori |
| 2015/0325447 | A1* | 11/2015 | Ogawa .............. H01L 21/28088 438/680 |
| 2016/0126337 | A1 | 5/2016 | Tominari et al. |
| 2016/0141173 | A1 | 5/2016 | Moriya et al. |
| 2016/0305023 | A1 | 10/2016 | Moriya et al. |
| 2017/0316946 | A1* | 11/2017 | Bajaj .................. H01L 21/3065 |

FOREIGN PATENT DOCUMENTS

| | | |
|---|---|---|
| JP | 2003-218037 A | 7/2003 |
| JP | 2007-305798 A | 11/2007 |
| JP | 2012-146741 A | 8/2012 |
| KR | 10-2009-0037424 A | 4/2009 |
| KR | 10-2016-0059952 A | 5/2016 |
| TW | 201637135 A | 10/2016 |

OTHER PUBLICATIONS

Taiwanese Office Action dated Mar. 29, 2019 for the Taiwanese Patent Application No. 107106383.
Singaporean Written Opinion dated Jun. 13, 2018 for the Singaporean Patent Application No. 10201802150Y.
Singaporean Search Report dated Jun. 19, 2018 for the Singaporean Patent Application No. 10201802150Y.
Korean Office Action dated Aug. 1, 2019 for the Korean Patent Application No. 10-2018-0030396.

* cited by examiner

METHOD OF MANUFACTURING SEMICONDUCTOR DEVICE, SUBSTRATE PROCESSING APPARATUS AND RECORDING MEDIUM

CROSS-REFERENCE TO RELATED APPLICATION

This application is based upon and claims the benefit of priority from Japanese Patent Application No. 2017-056142, filed on Mar. 22, 2017, the entire contents of which are incorporated herein by reference.

TECHNICAL FIELD

The present disclosure relates to a method of manufacturing a semiconductor device, a substrate processing apparatus and a recording medium.

BACKGROUND

As one of the processes of manufacturing a semiconductor device, a substrate processing process including a step of cleaning the surface of a substrate by using a hydrogen chloride gas and a step of cleaning the surface of the substrate by using a gas containing silicon halide and a chlorine gas is often carried out. A substrate processing process in which a step of epitaxially growing a silicon film on a substrate and a step of partially etching the silicon film by using a hydrogen chloride gas are alternately performed is also often carried out.

SUMMARY

Some embodiments of the present disclosure provide a technique capable of improving the productivity of a process of forming a silicon film on a substrate.

According to one embodiment of the present disclosure, there is provided a technique that includes (a) pre-etching a surface of a substrate made of single crystal silicon by supplying a first etching gas to the substrate; (b) forming a silicon film on the substrate with the pre-etched surface, by supplying a first silicon-containing gas to the substrate; (c) etching a portion of the silicon film by supplying a second etching gas, which has a different molecular structure from a molecular structure of the first etching gas, to the substrate; and (d) forming an additional silicon film on the etched silicon film by supplying a second silicon-containing gas to the substrate.

DETAILED DESCRIPTION

One Embodiment of the Present Disclosure

One embodiment of the present disclosure will now be described with reference to FIGS. 1 to 4 and FIGS. 5A to 5E.

(1) CONFIGURATION OF SUBSTRATE PROCESSING APPARATUS

Figure 1:
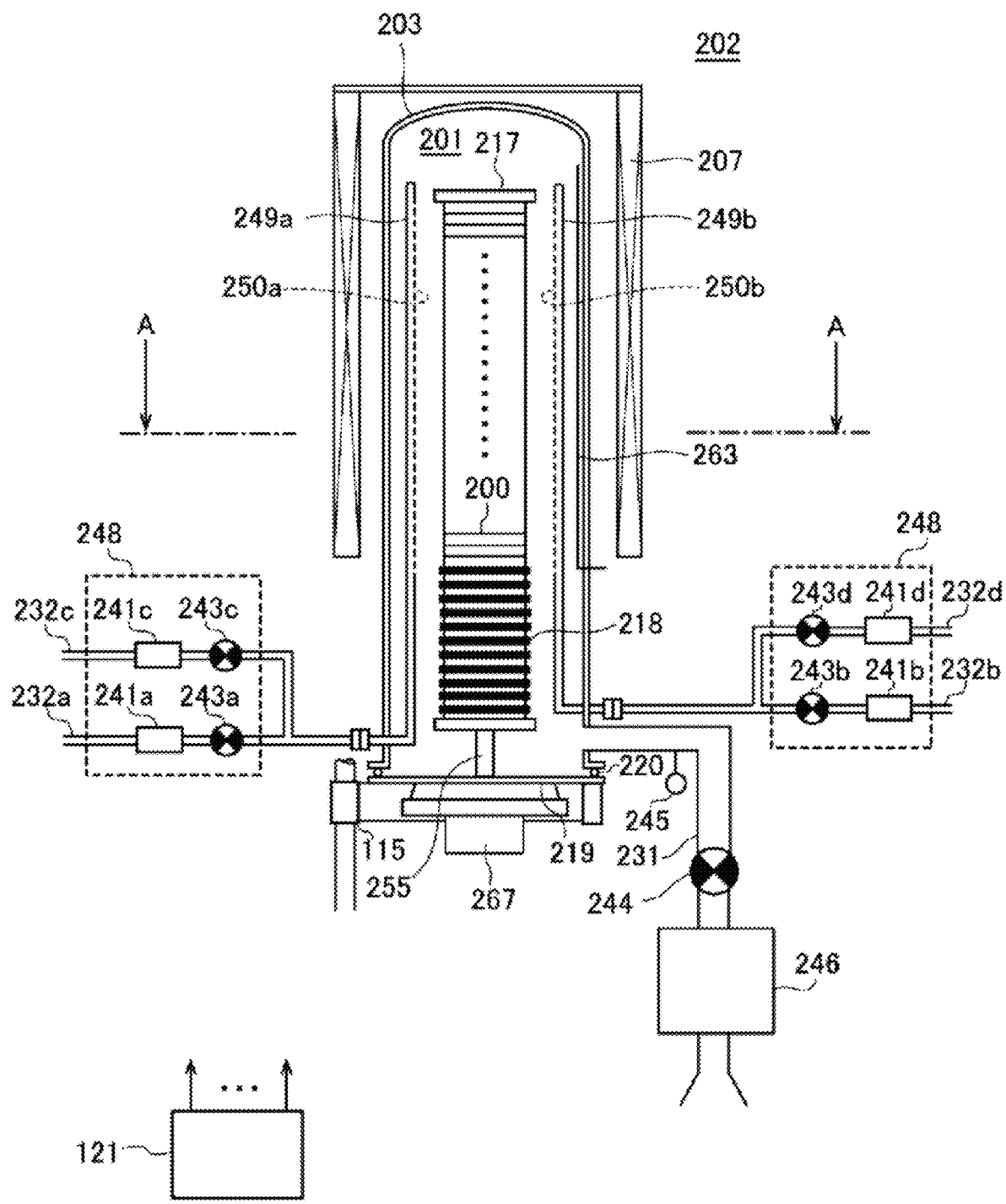
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating mechanism (a temperature adjustment part). The heater 207 has a cylindrical shape and is supported by a support plate so as to be vertically installed. The heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed inside the process chamber 201 so as to penetrate through the lower side wall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are sequentially installed in the gas supply pipes 232a and 232b, respectively, from upstream sides of gas flows. Gas supply pipes 232c and 232d for supplying an inert gas are connected to the gas supply pipes 232a and 232b, respectively, at downstream sides of the valves 243a and 243b. MFCs 241c and 241d and valves 243c to 243d are sequentially installed in the gas supply pipes 232c and 232d, respectively, from upstream sides of gas flows.

Figure 2:
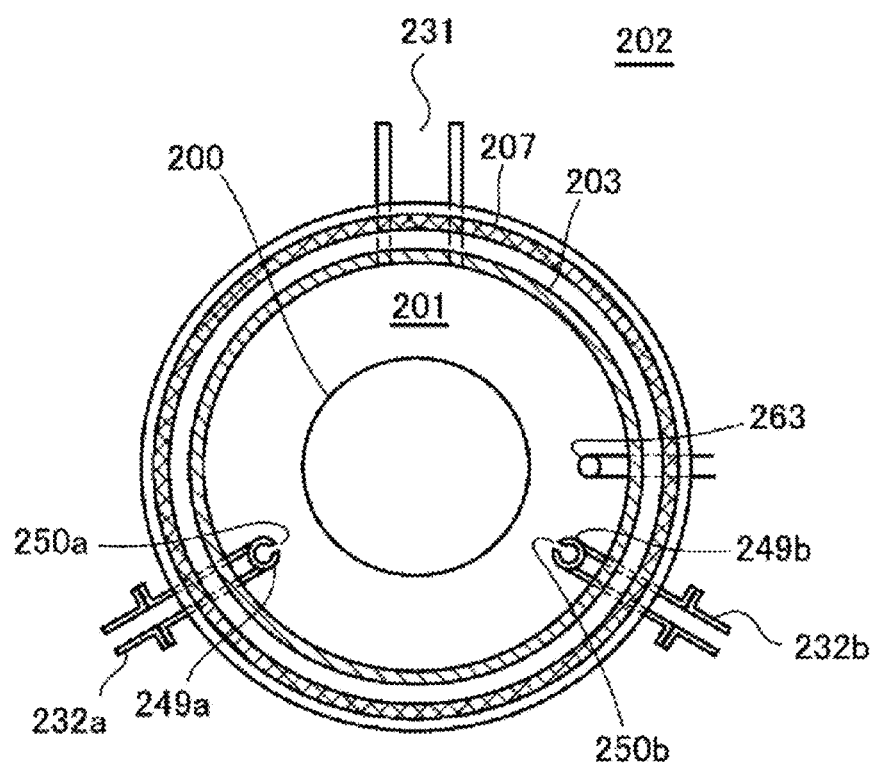
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As shown in FIG. 2, the nozzles 249a and 249b are disposed in an annular space between the inner wall of the reaction tube 203 and the wafers 200 such that the nozzles 249a and 249b extend upward along a stack direction of the wafers 200 from a lower portion of the inner wall of the reaction tube 203 to an upper portion thereof. Specifically, the nozzles 249a and 249b are installed in a region horizontally surrounding a wafer arrangement region in which the wafers 200 are arranged at a lateral portion of the wafer arrangement region, along the wafer arrangement region. Gas supply holes 250a and 250b for supplying a gas are formed on side surfaces of the nozzles 249a and 249b, respectively. The gas supply holes 250a and 250b are opened toward the center of the reaction tube 203 to allow the gas to be supplied toward the wafers 200. A plurality of gas supply holes 250a and 250b may be formed between the lower portion of the reaction tube 203 and the upper portion thereof.

A first etching gas is supplied from the gas supply pipe 232a into the process chamber 201 via the MFC 241a, the valve 243a and the nozzle 249a. As the first etching gas, it is possible to use, e.g., a gas containing one or more halogen atoms such as chlorine (Cl), fluorine (F), bromine (Br), iodine (I) or the like and containing no atoms other than the one or more halogen atoms. An example of such a gas may include chlorine ($Cl_2$) gas.

A second etching gas, which has a molecular structure different from that of the first etching gas, is also supplied from the gas supply pipe 232a into the process chamber 201 via the MFC 241a, the valve 243a and the nozzle 249a. As the second etching gas, it is possible to use, e.g., a gas containing one or more halogen atoms and also containing one or more atoms other than the one or more halogen atoms. An example of such a gas may include hydrogen chloride ($HC_2$) gas.

A silicon (Si)-containing gas is also supplied from the gas supply pipe 232a into the process chamber 201 via the MFC 241a, the valve 243a and the nozzle 249a. As the Si-containing gas, it is possible to use, e.g., a silicon hydride gas such as monosilane ($SiH_4$, abbreviation: MS) gas or disilane ($Si_2H_6$, abbreviation: DS) gas.

A dopant gas is supplied from the gas supply pipe 232b into the process chamber 201 via the MFC 241b, the valve 243b and the nozzle 249b. As the dopant gas, it is possible to use, e.g., phosphine ($PH_3$, abbreviation: PH) gas containing phosphorus (P) as dopants (impurities).

Hydrogen ($H_2$) gas as a hydrogen (H)-containing gas and nitrogen ($N_2$) gas as an inert gas are supplied from the gas supply pipes 232c and 232d into the process chamber 201 via the MFCs 241c and 241d, the valves 243c and 243d, the gas supply pipes 232a and 232b and the nozzles 249a and 249b, respectively.

Each of a first etching gas supply system (first supply system), a second etching gas supply system (second supply system) and a Si-containing gas supply system (third supply system) mainly includes the gas supply pipe 232a, the MFC 241a and the valve 243a. A dopant gas supply system (fourth supply system) mainly includes the gas supply pipe 232b, the MFC 241b and the valve 243b. A hydrogen-containing gas supply system (fifth supply system) and an inert gas supply system (sixth supply system) mainly include the gas supply pipes 232c and 232d, the MFCs 241c and 241d and the valve 243c and 243d, respectively.

Either or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d and is configured such that the operations of supplying various gases into the gas supply pipes 232a to 232d, such as the opening and closing operation of the valves 243a to 243d and the flow rate regulating operation by the MFCs 241a to 241d, and the like, are controlled by a controller 121 which will be described later. The integrated supply system 248 is configured as an integral type or division type integrated unit and can be attached to and detached from the gas supply pipes 232a to 232d or the like on an integrated unit basis. Further, the maintenance, replacement, extension and the like of the integrated supply system 248 can be performed on an integrated unit basis.

An exhaust pipe 231 for exhausting an internal atmosphere of the process chamber 201 is installed in the reaction tube 203. A vacuum pump 246, which is a vacuum exhaust device, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is operated and is also configured to regulate the internal pressure of the process chamber 201 by adjusting an opening degree of the valve based on pressure information detected by the pressure sensor 245 while the vacuum pump 246 is operated. An exhaust system mainly includes the exhaust pipe 231, the APC valve 244 and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is made of metal such as SUS or the like, and is formed in a disc shape. An O-ring 220, which is a seal member making contact with a lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument installed outside the reaction tube 203. The boat elevator 115 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz, SiC or the like. Heat insulating plates 218 made of a heat resistant material such as quartz, SiC or the like are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
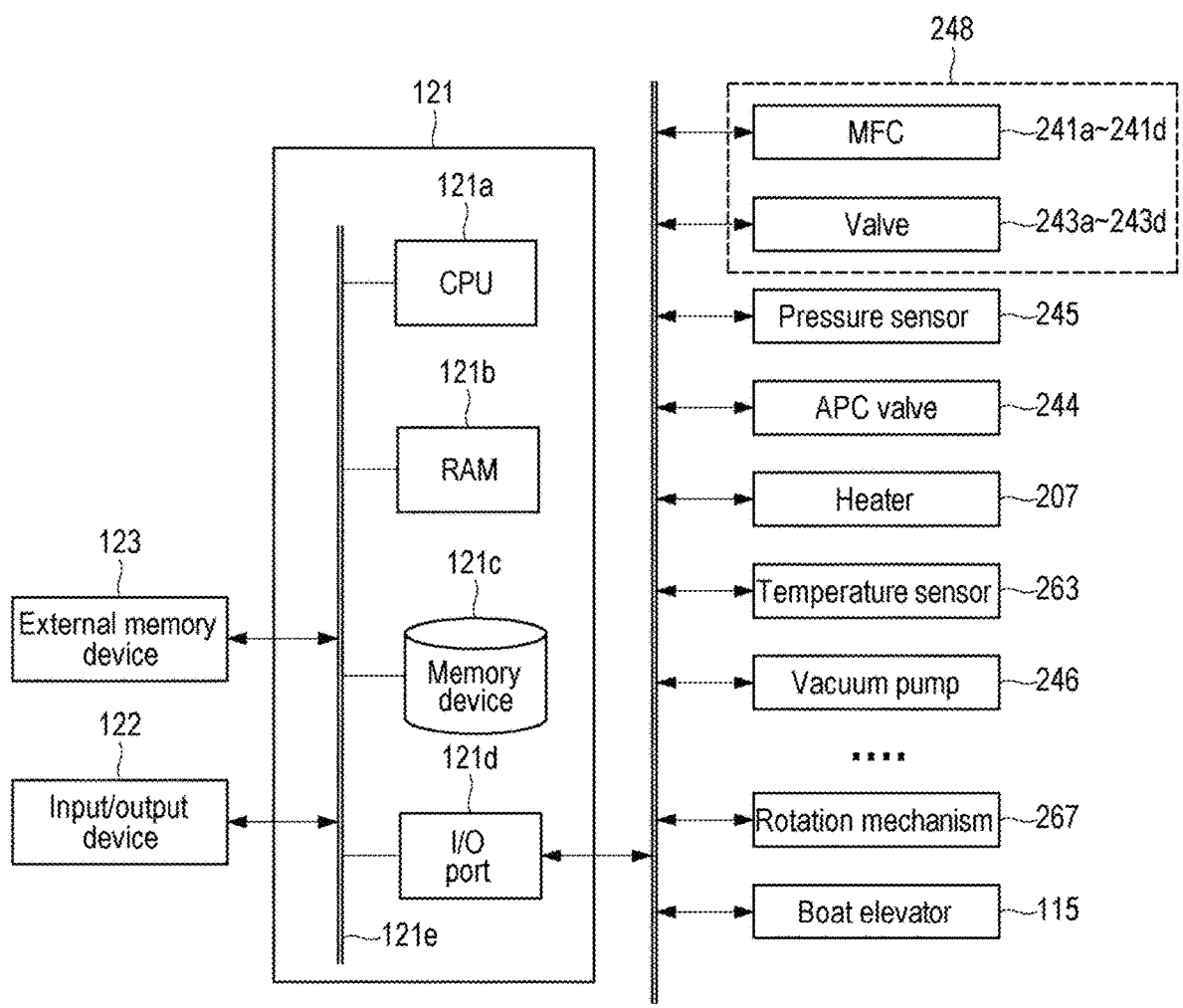
FIG. 3 is a schematic configuration diagram of a controller of the substrate processing apparatus suitably used in one embodiment of the present disclosure, in which a control system of the controller is shown in a block diagram.

As illustrated in FIG. 3, a controller 121, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described later are written, are readably stored in the memory device 121c. The process recipe function as a program for causing the controller 121 to execute each sequence in the substrate processing process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including the recipe, a case of including the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and so on.

The CPU 121a is configured to read and execute the control program from the memory device 121c. The CPU 121a is also configured to read the recipe from the memory device 121c according to an input of an operation command from the input/output device 122 or the like. The CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and so on, according to contents of the read recipe.

The controller 121 may be configured by installing, on a computer, the aforementioned program stored in an external memory device 123 (for example, a magnetic disk such as a hard disk, an optical disk such as a CD, a magneto-optical disk such as an MO, a semiconductor memory such as a USB memory, or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including the memory device 121c, a case of including the external memory device 123, or a case of including both the memory device 121c and the external memory device 123. Alternatively, the program may be supplied to the computer using communication means such as the Internet or a dedicated line, instead of using the external memory device 123.

(2) SUBSTRATE PROCESSING PROCESS

A sequence example of forming a Si film on a wafer 200 as a substrate using the aforementioned substrate processing apparatus, which is one of the processes for manufacturing a semiconductor device, will be described below with reference to FIGS. 4 and 5A to 5E. In the following description, the operations of the respective parts constituting the substrate processing apparatus are controlled by the controller 121.

Figure 4:
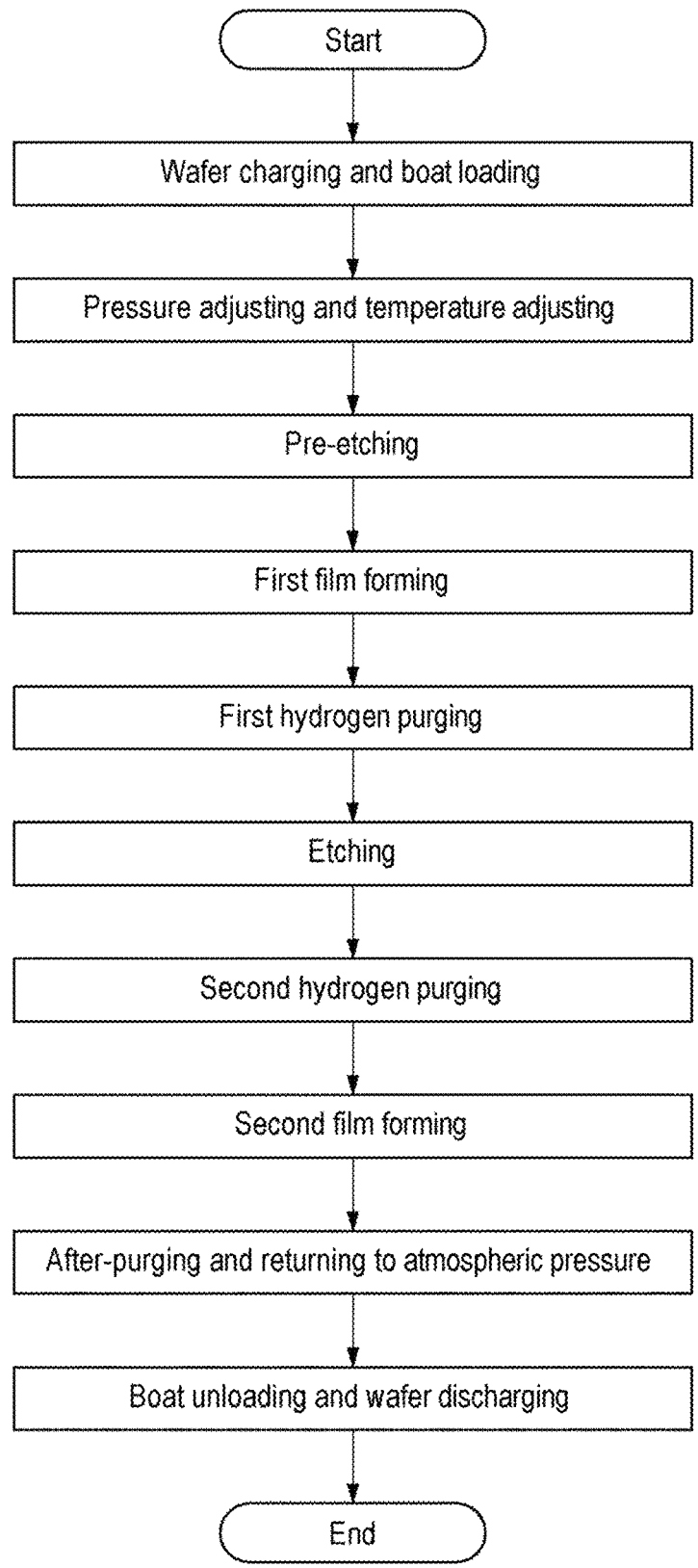
FIG. 4 is a flowchart illustrating a substrate processing sequence according to one embodiment of the present disclosure.

A film forming sequence illustrated in FIG. 4 includes a step of pre-etching the surface of a wafer 200 made of single crystal silicon by supplying a $Cl_2$ gas as a first etching gas to the wafer 200 (pre-etching step), a step of forming an Si film on the wafer 200 with the pre-etched surface by supplying an MS gas as an Si-containing gas to the wafer 200 (first film forming step), a step of etching a portion of the Si film by supplying an HCl gas as a second etching gas to the wafer 200 (etching step) and a step of further forming an Si film on the etched Si film by supplying an MS gas as an Si-containing gas to the wafer 200 (second film forming step).

As will be described later, in the film forming sequence shown in FIG. 4, these steps are performed in the same process chamber 201, that is, in-situ. Further, these steps are performed under the same temperature condition, specifically in a state where the temperature of the wafer 200 in the process chamber 201 is maintained at a predetermined temperature within the range of 450 to 550 degrees C. (equal to or higher than 450 degrees C. and equal to or lower than 550 degrees C.). Specifically, these steps are carried out under the condition of temperature which is equal to or lower than the crystallization temperature of Si, that is, the condition of temperature at which amorphous silicon is formed and which is equal to or less than the critical temperature (530 degrees C.) at which polycrystalline silicon begins to be formed. More preferably, these steps are carried out under the condition of temperature which is less than the crystallization temperature of the Si film, that is, under the condition of temperature condition which is less than the above-mentioned critical temperature.

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer or the like formed on a wafer". In the present disclosure, the expression "a predetermined layer is formed on a wafer" may mean that "a predetermined layer is directly formed on a surface of a wafer itself" or that "a predetermined layer is formed on a layer or the like formed on a wafer." When the term "substrate" is used in the present disclosure, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 via the O-ring 220.

Figure 5A:
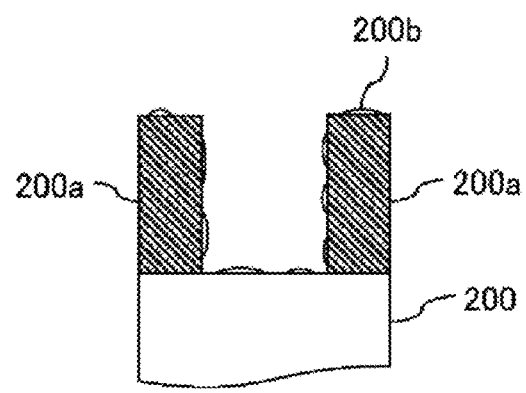
FIG. 5A is an enlarged sectional view illustrating the surface stricture of a wafer before a pre-etching step is initiated.

As the wafer 200, for example, a Si substrate formed of single crystal Si or a substrate having a single crystal Si film formed on its surface may be used. As illustrated in FIG. 5A, a concave portion is formed on the surface of the wafer 200. The bottom of the concave portion is made of single crystal Si, and the side and the top of the concave portion are constituted by an insulating film 200a such as a silicon oxide film (SiO film). The surface of the wafer 200 is in a state in which the single crystal Si and the insulating film 200a are exposed.

Before the wafer 200 is loaded into the process chamber 201, the surface of the wafer 200 is cleaned in advance with hydrogen fluoride (HF) or the like. However, the surface of the wafer 200 is temporarily exposed to the atmosphere until the wafer 200 is loaded into the process chamber 201 after the cleaning process. Therefore, a natural oxide film (SiO film) is formed on at least a portion of the surface of the wafer 200 loaded into the process chamber 201. The natural oxide film may be formed to sparsely (in an island shape) cover the bottom of the concave portion, that is a portion of the exposed single crystal Si and to continuously (in a non-island shape) cover the entire region of the exposed single crystal Si. In addition to the above-mentioned natural oxide film, residues (impurities or contaminants) made of organic substances or inorganic substances may be attached to at least a portion of the surface of the wafer 200. These natural oxide film and residues act to inhibit the film forming reaction on the wafers 200. FIG. 5A schematically illustrates these substances 200b that inhibit the film forming reaction.

(Pressure Adjustment and Temperature Adjustment)

The interior of the process chamber 201, namely the space in which the wafers 200 exist, is vacuum-exhausted (de-pressurization-exhausted) by the vacuum pump 246 so as to have a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to have a desired temperature. At this time, the state of supplying the electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be continuously performed at least until the processing of the wafers 200 is completed.

(Pre-Etching Step)

Thereafter, the $Cl_2$ gas is supplied to the wafer 200 in the process chamber 201. In this step, the valve 243a is opened to allow the $Cl_2$ gas to flow through the gas supply pipe 232a. A flow rate of the $Cl_2$ gas is adjusted by the MFC 241a, and then the $Cl_2$ gas is supplied into the process chamber 201 via the nozzle 249a and is exhausted from the exhaust pipe 231. At this time, the $Cl_2$ gas is supplied to the wafer 200. At this time, the valves 243c and 243d may be opened to allow the $H_2$ gas to flow through the gas supply pipes 232c and 232d. The $H_2$ gas is supplied into the process chamber 201 together with the $Cl_2$ gas and is exhausted from the exhaust pipe 231.

Figure 5B:
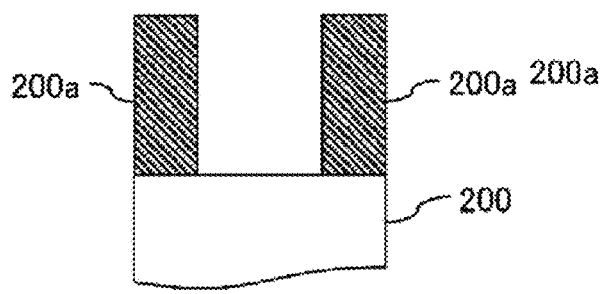
FIG. 5B is an enlarged sectional view illustrating the surface structure of the wafer after the pre-etching step is performed.

By supplying the $Cl_2$ gas to the wafer 200, it is possible to etch the surface of the water 200 slightly, that is, the surface of the single crystal Si constituting the bottom of the concave portion and the respective surfaces of the insulating film 200a constituting the side and top of the concave portion. That is, the etching action of the $Cl_2$ gas makes it possible for the surfaces of the single crystal Si to be peeled off and the insulating film 200a together with the substances 200b. Thereby, as illustrated in FIG. 5B, it becomes possible to remove the substances 200b present on the surfaces of the single crystal Si entirely and the insulating film 200a from these surfaces. As a result, dangling bonds of covalent bond of Si are generated at the bottom of the concave portion, that is, on the single crystal Si, which makes it possible to prepare an environment where the epitaxial growth is likely to proceed. In addition, it is possible to break the Si—O bond contained in the surface of the insulating film 200a on the side and top of the concave portion, that is, on the insulating film 200a. Thereby, it is possible to form a dangling bond of Si, that is, a Si adsorption site, on the surface of the insulating film 200a.

After the etching amount reaches a desired amount, the valve 243a is closed to stop of the supply of the $Cl_2$ gas into the process chamber 201. At this time, with the APC valve 244 kept opened, the interior of the process chamber 201 is exhausted by the vacuum pump 246. At this time, the valves 243c and 243d may be opened to supply the $N_2$ gas as a purge gas into the process chamber 201.

Examples of the processing conditions in this step are described as:

$Cl_2$ gas supply flow rate: 10 to 1,000 sccm $H_2$ gas supply flow rate (in each gas supply pipe): 100 to 5,000 sccm Gas supply time period: 5 to 30 minutes Processing temperature: the same temperature as the processing temperature in a first film forming step to be described later, for example, 450 to 550 degrees C., specifically 450 to 530 degrees C.

Processing pressure: 20 to 100 Pa

When the processing pressure is less than 20 Pa under the processing temperature described above, it may be difficult to continue to etch with the $Cl_2$ gas. By setting the processing pressure to a pressure of 20 Pa or higher under the processing temperature described above, it becomes possible to continue to etch with the $Cl_2$ gas at a practical rate. Under the processing temperature described above, when the processing pressure exceeds 100 Pa, the etching by the $Cl_2$ gas excessively proceeds, which may result in excessive etching damage on the surface of the wafer 200, that is, the single crystal Si or the insulating film 200a. It is possible to avoid this problem by setting the processing pressure at a pressure of 100 Pa or lower under the above-mentioned processing temperature.

As the first etching gas, in addition to the $Cl_2$ gas, a fluorine ($F_2$) gas, a nitrogen fluoride ($NF_3$) gas, a chlorine fluoride ($ClF_3$) gas or the like may be used. Since the number of one or more halogen atoms contained in one molecule of these gases is larger than the number of one or more halogen atoms contained in one molecule of HCl gas used as a second etching gas, these gases can be suitably used as the first etching gas. Among these gases, the $F_2$ gas, the $Cl_2$ gas and the $ClF_3$ gas contain one or more halogen atoms and do not contain an atom other than the one or more halogen atoms, so that they can be used more suitably as the first etching gas. In order to improve the controllability of the etching reaction, it is particularly preferable to use the $Cl_2$ gas among the $F_2$ gas, the $Cl_2$ gas and the $ClF_3$ gas.

As the inert gas, in addition to the $N_2$ gas, it may be possible to use, e.g., a rare gas such as Ar gas, He gas, Ne gas, Xe gas or the like.

(First Film Forming Step)

Thereafter, a MS gas and a PH gas are supplied to the wafer 200 in the process chamber 201. In this step, the opening/closing control of the valves 243a, 243c and 243d is performed in the same procedure as the opening/closing control of the valves 243a, 243c and 243d performed in the above-described pre-etching step. A flow rate of the MS gas flowing through the gas supply pipe 232a is adjusted by the MFC 241a and the MS gas is supplied into the process chamber 201 via the nozzle 249a and is exhausted from the exhaust pipe 231. At this time, the valve 243b is opened to allow the PH gas to flow through the gas supply pipe 232b. A flow rate of the PH gas is adjusted by the MFC 241b and the PH gas is supplied into the process chamber 201 via the nozzle 249b and is exhausted from the exhaust pipe 231. At this time, the MS gas and the PH gas are together (simultaneously) supplied to the wafer 200. The $N_2$ gas may be flown from the gas supply pipes 232c and 232d.

By supplying the MS gas and the PH gas to the wafer 200, Si contained in the MS gas is bonded to the dangling bond of Si formed on the surface of the single crystal Si in the pre-etching step at the bottom of the concave portion, to thereby grow a Si film 200g. This growth becomes the epitaxial growth under the processing conditions to be described later, and the crystal structure of the Si film 200g becomes a single crystal inheriting the crystallinity of the base. That is, the Si film 200g becomes a homoepitaxial Si film. Further, on the side and top of the concave portion, Si contained in the MS can be adsorbed onto the Si adsorption site formed on the surface of the insulating film 200a in the pre-etching step, thereby to grow a Si film 200h. This growth becomes amorphous growth, poly growth, or mixed crystal growth thereof under the processing conditions to be described later, and the crystal structure of the Si film 200h becomes amorphous, poly, or a mixed crystal thereof. That is, the Si film 200h becomes an amorphous Si film, a poly Si film, or a mixed crystal Si film thereof. By supplying the PH gas together with the MS gas, P components can be added to the Si films 200g and 200h so that these films can be doped Si films.

Figure 5C:
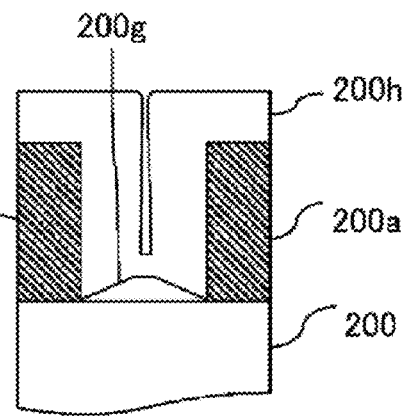
FIG. 5C is an enlarged sectional view illustrating the surface structure of the wafer after a first film forming step is ended.

By continuing the above-described process, as illustrated in FIG. 5C, the upper portion of the Si film 200g is covered with the Si film 200h grown from the side of the concave portion. Thereby, the epitaxial growth of the Si film 200g is stopped. In this state, a laminated structure is formed in the concave portion, that is, on the wafer 200, by laminating the Si film 200h on the Si film 200g. The Si film 200g is formed at the interface between the wafer 200 and the Si film 200h.

By further continuing the above-described process, at least the surface portion (opening portion) of the concave portion is blocked by the Si film 200h. That is, the surface portion of the concave portion is blocked by the Si film 200h grown so as to overhang from the side and top of the concave portion. However, at this step, a non-embedded region (void or seam) extending in the depth direction may occur in the concave portion. If the surface portion of the concave portion is blocked before the interior of the concave portion is completely filled with the Si film 200h, the MS gas does not reach the interior of the concave portion, stopping the growth of the Si film 200h in the concave portion and generating a void in the concave portion. The void is likely to occur as the aspect ratio of the concave portion (the depth of the concave portion/the width of the concave portion) increases, specifically, when the aspect ratio is 1 or larger, for example, 20 or larger, furthermore 50 or larger.

Before or after the surface portion of the concave portion is blocked by the Si film 200h, the valves 243a and 243b are closed to stop the supply of the MS gas and the PH gas into the process chamber 201. Then, the interior of the process chamber 201 is exhausted according to the same processing procedure as the pre-etching step. The supply of the MS gas and the PH gas may be stopped before or after the surface portion of the concave portion is completely blocked by the Si film 200h.

Examples of the processing conditions in this step are described as:

MS gas supply flow rate: 10 to 2,000 sccm

PH gas supply flow rate: flow rate at which the P concentration in the Si films 200g and 200h is, for example, $1.0 \times 10^{21}$ to $1.0 \times 10^{22}$ atoms/cm$^3$, for example 1 to 1,000 sccm $N_2$ gas supply flow rate (in each gas supply pipe): 100 to 10,000 sccm Gas supply time period: 20 to 400 minutes Processing temperature: 450 to 550 degrees C., specifically 450 to 530 degrees C.

Processing pressure: 1 to 900 Pa

When the processing temperature is less than 450 degrees C. or the processing pressure is less than 1 Pa, the MS is hardly decomposed, which may make it difficult to form the Si films 200g and 200h. The decomposition of MS can be promoted by setting the processing temperature to 450 degrees C. or higher or by setting the processing pressure to 1 Pa or higher, so that the formation of the Si films 200g and 200h can proceed at a practical rate.

In addition, when the processing temperature exceeds 550 degrees C. or the processing pressure exceeds 900 Pa, the act of decomposition of MS becomes severe, which may deteriorate the wafer in-plane film thickness uniformity and step coverage of the Si films 200g and 200h. The amount of particles generated in the process chamber 201 increases, which may deteriorate the quality of the film forming process. By setting the processing temperature to 550 degrees C. or lower or by setting the processing pressure to 900 Pa or lower, it is possible to avoid these problems by alleviating the act of decomposition of the MS gas. By setting the processing temperature to 530 degrees C. or lower, it is possible to more reliably avoid these problems. In addition, by setting the processing temperature to 530 degrees C. or lower, specifically lower than 530 degrees C., the crystal structure of the Si film 200h can be easily made amorphous, thereby increasing the etching rate in the etching step to be described later to improve the productivity. Since the crystallization temperature of Si is about 530 degrees C., the crystal structure of the Si film 200h can be made amorphous by setting the processing temperature to lower than 530 degrees C., can be made poly by setting the processing temperature to above 530 degrees C., and can be made a mixed crystal of amorphous silicon and polysilicon by setting the processing temperature to around 530 degrees C.

As the Si-containing gas, in addition to the MS gas, there may be possible to use a silicon hydride gas represented by the chemical formula $Si_nH_{2n+2}$ (n is an integer of 1 or more), such as DS gas, trisilane ($Si_3H_8$) gas, tetrasilane ($Si_4H_{10}$) or the like. As the Si-containing gas, there may also be possible to use a chlorosilane-based gas such as monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, hexachlorodisilane ($Si_2Cl_6$, abbreviation: HCDS) gas, octachlorotrisilane ($Si_3Cl_8$, abbreviation: OCTS) gas or the like. In order to prevent Cl from remaining in the Si films 200g and 200h, it is preferable to use the silicon hydride gas as the Si-containing gas. In order to increase the deposition rate of the Si films 200g and 200h, it is preferable to use the chlorosilane-based gas as the Si-containing gas.

As the dopant gas, in addition to a gas containing P such as the PH gas, there may be possible to use a gas containing arsenic (As) such as arsine (AsH$_3$) gas, that is, a gas containing a Group XV element as a dopant. As the dopant gas, there may also be possible to use a gas containing boron (B) such as diborane (B$_2$H$_6$) gas, trichloroborane (BCl$_3$) gas or the like, that is, a gas containing group XIII element as a dopant.

(First Hydrogen Purging Step)

Thereafter, the H$_2$ gas is supplied to the wafer 200 in the process chamber 201. In this step, the valves 243c and 243d are opened to flow the H$_2$ gas into the gas supply pipes 232c and 232d. A flow rate of the H$_2$ gas is adjusted by the MFCs 241c and 241d and the H$_2$ gas is supplied into the process chamber 201 through the gas supply pipes 232a and 232b and the nozzles 249a and 249b and is exhausted from the exhaust pipe 231. At this time, the H$_2$ gas is supplied to the wafer 200. By supplying the H$_2$ gas to the wafer 200, the surface of the Si film 200h formed on the wafer 200 can be hydrogen-terminated to facilitate cleaning of the entire surface thereof.

After cleaning the entire surface of the Si film 200h, the valves 243c and 243d are closed to stop the supply of the H$_2$ gas into the process chamber 201. Then, the interior of the process chamber 201 is exhausted according to the same processing procedure as the pre-etching step.

Examples of the processing conditions in this step are described as:

H$_2$ gas supply flow rate: 500 to 3,000 sccm
H$_2$ gas supply time period: 30 to 120 minutes
Processing temperature: the same temperature as the processing temperature in the first film forming step, for example, 450 to 550 degrees C., specifically 450 to 530 degrees C.
Processing pressure: 500 to 2,000 Pa (Etching Step)

Thereafter, the HCl gas is supplied to the wafer 200 in the process chamber 201. In this step, the valve 243a is opened to flow the HCl gas into the gas supply pipe 232a. A flow rate of the HCl gas is adjusted by the MFC 241a and the HCl gas is supplied into the process chamber 201 through the nozzle 249a and is exhausted from the exhaust pipe 231. At this time, the HCl gas is supplied to the wafer 200. At this time, the valves 243c and 243d are closed and the supply of the N$_2$ gas and the H$_2$ gas into the process chamber 201 is not performed.

Figure 5D:
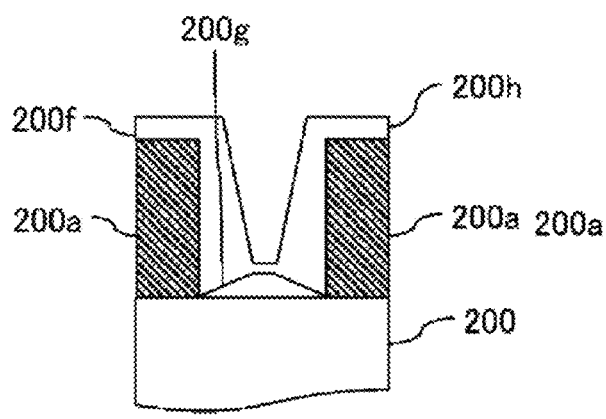
FIG. 5D is an enlarged sectional view illustrating the surface structure of the wafer after an etching step is ended.
Figure 5E:
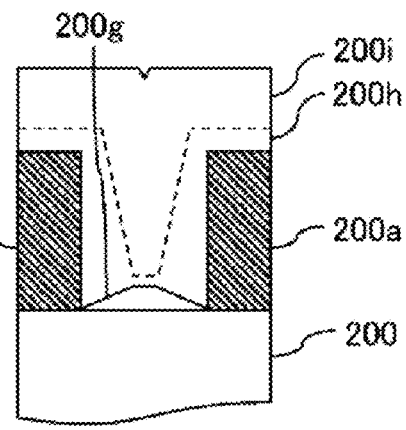
FIG. 5E is an enlarged sectional view illustrating the surface structure of the wafer after a second film forming step is ended.

By supplying the HCl gas to the wafer 200, it is possible to partially etch the Si film 200h formed on the wafer 200. By removing a portion of the Si film 200h that closes the surface portion of the concave portion, it is possible to open the upper portion of the void formed thereunder to expose the void. In this state, by continuously supplying the HCl gas to the wafer 200 for a predetermined time period, the Si film 200h constituting the inner wall (the side wall and the bottom) of the void can be further etched to extend the opening. The supply amount of the HCl gas to the interior of the void gradually decreases from the surface portion to the bottom portion. Therefore, as illustrated in FIG. 5D, the longitudinal section of the void has a V shape or an inverted trapezoidal shape in which the opening width gradually increases from the bottom portion to the surface portion. By forming the exposed void into such a shape, it becomes possible to promote the supply of the MS gas to the interior of the exposed void in a second film forming step to be described later. As a result, it becomes possible to completely fill the interior of the concave portion with the Si film so as to be in a void-free state. The etching with the HCl gas is preferably performed within a range where the Si film 200g covered with the Si film 200h is not exposed, that is, within a range where the underlying Si film 200g is not etched. That is, it is preferable to control the end point of etching so that only the amorphous Si, poly Si, or mixed crystal Si thereof is exposed on the inner wall of the void and the single crystal Si (epitaxial Si) is not exposed at the point of time at which the etching is completed.

After the amount of etching reaches a desired amount, the valve 243a is closed to stop the supply of the HCl gas into the process chamber 201. Then, the interior of the process chamber 201 is exhausted according to the same processing procedure as the pre-etching step.

Examples of the processing conditions in this step are described as:

HCl gas supply flow rate: 100 to 10,000 sccm
HCl gas supply time period: 10 to 60 minutes
Processing temperature: the same temperature as the processing temperature in the first film forming step, for example, 450 to 550 degrees C., specifically 450 to 530 degrees C.
Processing pressure: pressure higher than the processing pressure in the pre-etching step, for example, 1,000 to 50,000 Pa, specifically 10,000 to 40,000 Pa, more specifically 20,000 to 30,000 Pa If the processing pressure is lower than 1,000 Pa under the above processing temperature, it may be difficult to proceed with the etching by the HCl gas, or the in-plane uniformity of the etching amount may deteriorate. By setting the processing pressure at a pressure of 1,000 Pa or higher under the above-mentioned processing temperature, it becomes possible to proceed with the etching with the HCl gas at a practical rate and to increase the in-plane uniformity of the etching amount. By setting the processing pressure to a pressure of 10,000 Pa or higher, it becomes possible to further increase the etching rate by the HCl gas and to further increase the in-plane uniformity of the etching amount. By setting the processing pressure to a pressure of 20,000 Pa or higher, these effects can be more reliably obtained.

Under the above-mentioned processing temperature, when the processing pressure exceeds 50,000 Pa, the etching by the HCl gas proceeds excessively, which may make it difficult to realize the shape control at the time of void forming and the end point control of etching. It is possible to avoid these problems by setting the processing pressure to a pressure of 50,000 Pa or lower under the above-mentioned processing temperature. By setting the processing pressure at a pressure of 40,000 Pa or lower, it is possible to reliably avoid these problems. By setting the processing pressure at a pressure of 30,000 Pa or lower, it is possible to avoid these problems more reliably.

The processing conditions described here include conditions under which the amorphous state of the Si film 200h formed on the wafer 200 in the first film forming step is maintained, that is, conditions under which crystallization of the Si film 200h is prevented. The conditions for preventing the crystallization of the Si film 200h are also conditions under which the Si film 200h is not made poly-crystallized and also not made epitaxial (single-crystallized). These conditions are also conditions under which the in-plane uniformity of the etching amount of the Si film 200h is maintained, that is, conditions under which the etching amount of the Si film 200h becomes uniform over the entire area of the wafer in-plane. By setting the temperature of the wafer 200 to a temperature at which amorphous silicon is formed and which is equal to or lower than the critical temperature of about 530 degrees C. at which polycrystalline silicon begins to be formed, it is easy to maintain the amorphous state of the Si film 200h. By setting the temperature of the wafer 200 to a temperature of lower than 530 degrees, the amorphous state of the Si film 200h can be reliably maintained.

(Second Hydrogen Purging Step)

Thereafter, the $H_2$ gas is supplied to the wafer 200 in the process chamber 201 according to the same processing procedure as the first hydrogen purging step. Thereby, Cl remaining in the process chamber 201 can be excluded from the interior of the process chamber 201. Thereafter, the interior of the process chamber 201 is exhausted according to the same processing procedure as the first hydrogen purging step. The supply time period of the $H_2$ gas is set to fall within a range of, e.g., 10 to 60 minutes. The other processing conditions are the same as the processing conditions in the first hydrogen purging step.

(Second Film Forming Step)

Thereafter, the MS gas and the PH gas are supplied to the wafer 200 in the process chamber 201 according to the same processing procedure as the first film forming step. The supply time period of the MS gas and the PH gas is set to fall within a range of, e.g., 10 to 300 minutes. The other processing conditions are the same as the processing conditions in the first film forming step.

By supplying the MS gas and the PH gas to the wafer 200, it is possible to grow a Si film 200i over the wafer 200, that is, on the surface of the etched Si film 200h. Like the Si film 200h, the Si film 200i also becomes a doped Si film doped with P. As described above, the processing conditions in the second film forming step are the same as the processing conditions in the first film forming step except for the gas supply time period. In addition, on the inner wall of the void in which the opening is widened, epitaxial Si is not exposed but only amorphous Si, poly Si or mixed crystal Si thereof is exposed. Therefore, the growth of the Si film 200i becomes amorphous growth, poly growth, or mixed crystal growth thereof, similarly to the growth of the Si film 200h. The surface of the Si film 200h is covered with the Si film 200i in an amorphous state, a poly state or a mixed crystal state thereof. In addition, the interior of the void is completely filled in the void-free state with the Si film 200i in the amorphous state, the poly state or their mixed crystal state thereof.

Thereafter, the valves 243a and 243b are closed to stop the supply of the MS gas and the PH gas, respectively, into the process chamber 201. Then, the interior of the process chamber 201 is exhausted according to the same processing procedure as the above-described pre-etching step.

(After-Purging and Returning to Atmospheric Pressure)

After the second film forming step is completed, the $N_2$ gas is supplied from each of the gas supply pipes 232c and 232d into the process chamber 201 and is exhausted from the exhaust pipe 231. The $N_2$ gas acts as a purge gas. Thus, the interior of the process chamber 201 is purged with the inert gas, removing a gas remaining in the process chamber 201 and reaction byproducts from the interior of the process chamber 201 (after purging). Thereafter, the internal atmosphere of the process chamber 201 is replaced with the inert gas (inert gas replacement), and the internal pressure of the process chamber 201 returns to the normal pressure (returning to atmospheric pressure).

(Boat Unloading and Wafer Discharging)

The seal cap 219 is lowered by the boat elevator 115 to open the lower end of the reaction tube 203. Then, the processed wafers 200 supported by the boat 217 are unloaded from the lower end of the reaction tube 203 outside of the reaction tube 203 (boat unloading). The processed wafers 200 are discharged from the boat 217 (wafer discharging).

(3) EFFECTS ACCORDING TO THE PRESENT EMBODIMENT

According to the present embodiment, one or more effects set forth below may be achieved.

(a) By performing the pre-etching step before carrying out the first film forming step, an environment where the epitaxial growth is likely to proceed on the single crystal Si (the bottom of the concave portion) can be prepared, and a Si adsorption site can be formed on the insulating film 200a (the side and top of the concave portion). Thus, in the first film forming step, under a low temperature of 450 to 550 degrees C., it is possible to grow a homoepitaxial Si film on the single crystal Si and grow an amorphous Si film, a poly Si film or a mixed crystal Si film thereof on the insulating film 200a. That is, by performing the pre-etching step, it is possible to grow Si films having different crystal structures in parallel on the single crystal Si and the insulating film 200a in the first film forming step. As a result, it is possible to form a laminated structure (laminated film) including the amorphous Si film, the poly Si film or the mixed crystal Si film thereof (the Si film 200h) on the homoepitaxial Si film (the Si film 200g) on the surface (single crystal Si) of the wafer 200, that is, in the concave portion. Since this laminated film includes the homoepitaxial Si film (the Si film 200g) on the lower layer side, that is, at the interface with the single crystal Si, the contact resistance with the wafer 200 and the like can be reduced, thereby improving the electric characteristics.

(b) By performing the pre-etching step before carrying out the first film forming step, an environment where the epitaxial growth is likely to proceed on the bottom of the concave portion can be prepared and a Si adsorption site can be formed on the side and top of the concave portion. Thus, it is possible to form a Si film having excellent wafer in-plane film thickness uniformity and step coverage on the wafer 200. In addition, by performing the etching step between the first film forming step and the second film forming step, it is possible to form a high quality Si film having excellent embeddability and including no voids and seams on the wafer 200.

(c) In the pre-etching step, since the $Cl_2$ gas having relatively high reactivity is used as the first etching gas, the productivity of substrate processing can be increased.

As an alternative to this embodiment, a method using the HCl gas as the first etching gas is also conceivable. However, since the number of the one or more halogen atoms contained in one molecule of the HCl gas is smaller than the number of the one or more halogen atoms contained in one molecule of the $Cl_2$ gas, the HCl gas has lower reactivity than the $Cl_2$ gas. Therefore, under the processing temperature (within the range of 450 to 550 degrees C., specifically 450 to 530 degrees C.) illustrated in the above-described pre-etching step, the surface of the wafer 200 made of single crystal Si having relatively high etching resistance is hardly etched at a practical rate.

As another alternative to this embodiment, it may be also conceivable to use the HCl gas as the first etching gas and set the processing temperature in the pre-etching step to be higher than the processing temperature in this embodiment (for example, about 650° C. which is higher by 100 degrees C. or higher). In this case, the etching by the HCl gas can be promoted. However, in this case, before or after the pre-etching step, it is necessary to newly provide a temperature raising step of raising the internal temperature of the process chamber 201 by 100 degrees C. or more and remaining until the temperature is stabilized, or a temperature lowering step of lowering the internal temperature of the process chamber 201 by 100 degrees C. or more and remaining until the temperature is stabilized, which may result in an increase in the total time period required for the substrate processing.

In contrast to these alternatives, in the present embodiment, the $Cl_2$ gas having high reactivity is used as the first etching gas so that, under the processing temperature illustrated in the above-described pre-etching step, the surface of the wafer 200 made of the single crystal Si can be etched at a practical rate. Further, in the present embodiment, the processing temperature in the pre-etching step can be set to a temperature equal to the processing temperature in the first film forming step performed subsequently. Therefore, it is unnecessary to provide a temperature raising step or a temperature lowering step before and after the pre-etching step, thereby avoiding an increase in the total time period required for the substrate processing.

(d) Since the HCl gas having relatively low reactivity is used as the second etching gas in the etching step, it is possible to improve the wafer in-plane uniformity of the etching amount and increase the productivity of the substrate processing.

As an alternative to the present embodiment, a method using the $Cl_2$ gas, the $F_2$ gas, the $NF_3$ gas, the $ClF_3$ gas or the like as the second etching gas is also conceivable. However, since the number of the one or more halogen atoms contained in one molecule of these gases is larger than the number of the one or more halogen atoms contained in one molecule of the HCl gas, these gases have higher reactivity than the HCl gas. In addition, since the crystal structure of the Si film 200h is amorphous, poly or a mixed crystal thereof, it is easier to etch the Si film 200h than the wafer 200 made of single crystal Si (in addition, in comparison between the amorphous Si film and the poly Si film, the amorphous Si film is more likely to be etched than the poly Si film). Further, since the Si film 200h is doped with P, the Si film 200h is more easily etched than the Si film 200h made of non-doped Si. From this point, in the case of using this alternative method, the etching of the Si film 200h excessively proceeds under the processing temperature (temperature within the range of 450 to 550 degrees C.) illustrated in the above etching step, which deteriorates the wafer in-plane uniformity of the etching amount and makes it difficult to control the end point of etching.

As another alternative to this embodiment, it is also conceivable to use a method of using the $Cl_2$ gas, the $F_2$ gas, the $NF_3$ gas, the $ClF_3$ gas or the like as the second etching gas and setting the processing temperature in the etching step to be lower than the processing temperature illustrated in the etching step (for example, a temperature of about 350 degrees C. lower by 100 degrees C. or more). In this case, it is possible to suppress the continuous etching by the gas. However, in this case, it is necessary to newly provide a temperature lowering step and a temperature raising step before and after the etching step, which may result in an increase in the total time period required for the substrate processing.

In contrast to these alternative methods, in this embodiment, since the HCl gas having low reactivity is used as the second etching gas, the etching of the Si film 200h proceeds at an appropriate rate under the processing temperature illustrated in the above etching step, thereby improving the wafer in-plane uniformity of the etching amount and precisely controlling the end point of the etching. Further, in the present embodiment, the processing temperature in the etching step can be set to a temperature equal to the processing temperature in the first film forming step and the second film forming step performed before and after the etching step. Therefore, it is unnecessary to provide a temperature lowering step and a temperature raising step before and after the etching step, thereby avoiding an increase in the total time period required for the substrate processing.

(e) As described above, in the present embodiment, since the first and second etching gases are properly selected in consideration of their respective reactivities, a series of steps from the pre-etching step to the second film forming step can be carried out consistently under the same temperature, eliminating a need to provide a temperature lowering step or a temperature raising step between the pre-etching step and the second film forming step. Thereby, it is possible to simplify the procedure of substrate processing or shorten the total time period required for substrate processing, thereby significantly improving the productivity of substrate processing.

(f) When the amorphous Si film 200h is formed in the first film forming step, by performing the etching step under the temperature at which the amorphous state of the Si film 200h is maintained, it is possible to maintain the Si film 200h at a high etching rate. In this case, since local crystallization of a portion of the Si film 200h can be avoided, it is possible to avoid the deterioration of the surface roughness of the Si film (the laminated film including the Si film 200h and the Si film 200i) finally formed on the wafer 200, that is, the reduction of the smoothness of the surface of the film. In addition, in this case, it is preferable that a series of steps from the pre-etching step to the second film forming step is performed consistently under the temperature of less than 530 degrees C. at which the amorphous state of the Si film 200h is maintained.

(g) By performing the etching step under a pressure higher than the processing pressure in the pre-etching step or the first film forming step, that is, a pressure in the range of 1,000 to 50,000 Pa, specifically 10,000 to 40,000 Pa, more specifically 20,000 to 30,000 Pa, it becomes possible to efficiently continue etching the Si film 200h. Further, it is possible to maintain the wafer in-plane uniformity of the etching amount to thereby improve the in-plane film thickness uniformity of the finally formed Si film and to keep the surface roughness good.

(h) By doping P in the Si film 200h so that the concentration thereof is set to fall within a range of, for example, $1.0 \times 10^{21}$ to $1.0 \times 10^{22}$ atoms/cm$^3$, it is possible to increase the etching rate of the Si film 200h in the etching step. This makes it possible to shorten the total time period required for substrate processing and to improve the productivity of substrate processing.

(i) By performing the etching step without etching the underlying Si film 200g, it is possible to keep a high etching rate. Further, it is possible to improve the in-plane film thickness uniformity of the finally formed Si film and keep the surface roughness good. Further, it is possible to maintain a state in which the Si film 200g is not exposed on the outermost surface of the wafer 200 and to grow the Si film 200i by amorphous growth, poly growth or mixed crystal growth thereof in the second film forming step. Since the growth rate of amorphous growth, poly growth or mixed crystal growth thereof is higher than that of the epitaxial growth, it is possible to shorten the total time period required for substrate processing. It is also possible to prevent the re-occurrence of voids due to a difference in the growth rate of the Si film 200*i* in the concave portion whose shape has been adjusted by etching.

(j) By performing the first hydrogen purging step before the etching step, the surface of the Si film 200*h* is cleaned, thereby increasing the efficiency of etching performed thereafter or improving the wafer in-plane uniformity of the etching amount. Further, by performing the second hydrogen purging step after the etching step, it is possible to increase the efficiency of removal of Cl from the interior of the process chamber 201, thereby improving the film quality of the Si film 200*i* to be formed later.

(k) Since a series of steps from the pre-etching step to the second film forming step is performed in-situ, the wafer 200 is not exposed to the atmosphere during the process so as to consistently process the wafer 200 in a clean atmosphere, thereby facilitating stable substrate processing.

(l) The above-described effects can be obtained in the same manner even in a case of using the above-mentioned first etching gas other than the $Cl_2$ gas, a case of using the above-mentioned Si-containing gas other than the MS gas, a case of using the above-mentioned dopant gas other than the PH gas, and a case of using the above-mentioned inert gas other than the gas.

(4) MODIFICATION EXAMPLES

This embodiment can be modified as in the following modification examples. Further, these modification examples may be used in proper combination.

Modification Example 1

The P concentration in the Si film 200*h* formed before the etching step may be higher than the P concentration in the Si film 200*i* formed after the etching step. By increasing the P concentration in the Si film 200*h* to be etched to be higher than the P concentration in the Si film 200*i*, for example, the above-described effects of improving the etching rate can be enhanced.

Modification Example 2

The Si film 200*i* formed after the etching step may be a non-doped Si film not doped with P. By increasing the P concentration in the Si film 200*h* to be etched to be higher than the P concentration in the Si film 200*i*, for example, the above-described effects of improving the etching rate can be obtained in the same manner.

Modification Example 3

By increasing the supply flow rate and the partial pressure of the PH gas during the first film forming step, the P concentration in a portion of the Si film 200*h* on the surface portion to be etched in the etching step may be higher than the P concentration in the other portions. By particularly increasing the P concentration in the portion in the Si film 200*h* to be etched, the above-described effects of improving the etching rate can be further enhanced.

Modification Example 4

The execution of one or both of the first hydrogen purging step and the second hydrogen purging step may be omitted.

Modification Example 5

In the film forming sequence described above, the case where the series of steps from the first film forming step to the second film forming step is performed once after the pre-etching step has been described. However, the series of steps from the first film forming step to the second film forming step may be performed multiple times.

Other Embodiments of the Present Disclosure

While some embodiments of the present disclosure have been specifically described above, the present disclosure is not limited to the aforementioned embodiments but may be differently modified without departing from the subject matter of the present disclosure.

A plurality of recipes used for substrate processing may be individually prepared according to the contents of substrate processing and may be stored in the memory device 121*c* via an electrical communication line or the external memory device 123. Then, when the substrate processing is initiated, the CPU 121*a* may appropriately select an appropriate recipe from the plurality of recipes stored in the memory device 121*c* according to the substrate processing contents. With this configuration, films having a variety of film types, composition ratios, film qualities and film thicknesses can be formed with high reproducibility in a single substrate processing apparatus. In addition, it is possible to reduce an operator's burden and to quickly initiate the substrate processing while avoiding an operation error.

The recipes mentioned above are not limited to newly-prepared ones but may be prepared by, for example, altering the existing recipes already installed in the substrate processing apparatus. When altering the recipes, the altered recipes may be installed in the substrate processing apparatus via a telecommunication line or a recording medium storing the recipes. In addition, the existing recipes already installed in the substrate processing apparatus may be directly altered by operating the input/output device 122 of the substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or a plurality of substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace. Even in the case of using these substrate processing apparatuses, film formation can be performed under the same sequence and processing conditions as in the above embodiments and modification examples, and the same effects as those of the above embodiments and modification examples can be obtained.

The Si filer formed by the method of the above embodiments can be suitably used for applications such as forming contact plugs by filling contact holes.

The aforementioned embodiments and modification examples may be used in proper combination. In addition, the procedures and processing conditions used at this time may be the same as those of the aforementioned embodiments.

EMBODIMENT EXAMPLES

Hereinafter, Embodiment Examples will be described.

As an Embodiment Example, the substrate processing apparatus shown in FIG. 1 was used to form a Si film on a wafer by sequentially performing the pre-etching step and the first film forming step of the film forming sequence shown in FIG. 4. As the wafer, a wafer having a concave portion formed on surface of the wafer, with the bottom part of the concave portion being made of the single crystal Si and the side part and the top part of the concave portion being made of an insulating film (SiO), was used. The $Cl_2$ gas was used as the first etching gas, the MS gas was used as the Si-containing gas, and the PH gas was used as the dopant gas. The processing temperature in each step was set to a temperature within the range of 450 to 500 degrees C. The other processing conditions in each step were predetermined conditions within the processing condition range described in each step of the above embodiment. The time period required for the pre-etching step was set to about 10 minutes.

As Reference Example, the substrate processing apparatus shown in FIG. 1 was used to form a Si film on a wafer by sequentially performing a seed layer forming step, a temperature raising step and the first film forming step of the film forming sequence shown in FIG. 4. As the wafer, the same wafer as in the Embodiment Example was used. In the seed layer forming step, a seed layer having a thickness in the range of 1 to 50 Å was formed on the wafer by alternately repeating the supply of DCS gas to the wafer and the supply of DS gas to the wafer under the processing temperature set to a temperature within the range of 350 to 450 degrees C. and the processing pressure set to a pressure within the range of 1 to 1,000 Pa. The time period required to form the seed layer was approximately 20 minutes. In the temperature raising step, the temperature of the wafer in the process chamber was increased from the processing temperature (the temperature within the range of 350 to 450 degrees C.) in the seed layer forming step to the processing temperature (the temperature within the range of 450 to 500 degrees C.) in the first film forming step, and remained until the temperature of the wafer was stabilized. The time period required for the temperature raising step was about 60 minutes. The processing conditions in the first film forming step were the same as those in the first film forming step of the Embodiment Example.

As Comparative Example, the substrate processing apparatus shown in FIG. 1 was used to form a Si film on a wafer by performing the first film forming step of the film forming sequence shown in FIG. 4. In the Comparative Example, no pre-etching step was performed. As the wafer, the same wafer as in the Embodiment Example was used. The processing conditions in the first film forming step were the same as those in the first film forming step of the Embodiment Example.

Figure 6A:
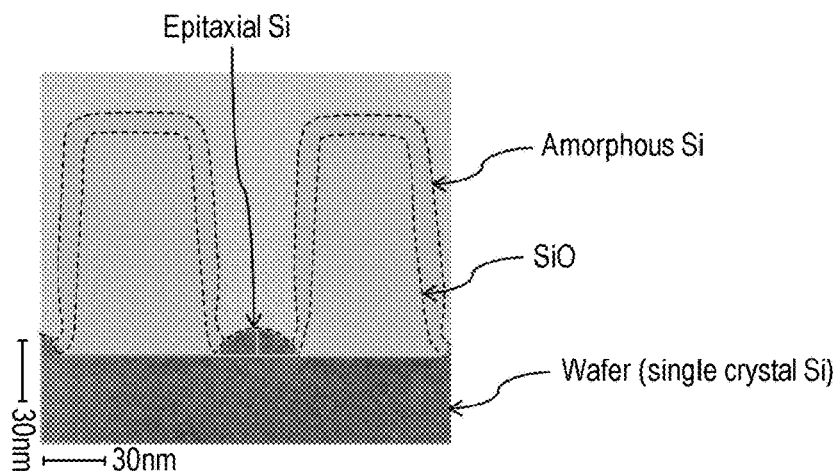
FIG. 6A is a view showing a cross-sectional enlarged photograph of the surface of a wafer in Example.

The sectional structures of the Si films of the Embodiment Example, Reference Examples and Comparative Examples were respectively observed. FIG. 6A is a view showing a cross-sectional enlarged photograph of the surface of the wafer in the Embodiment Example, FIG. 6B is a view showing a cross-sectional enlarged photograph of the surface of the wafer in the Reference Example, and FIG. 6C is a view showing a cross-sectional enlarged photograph of the surface of the wafer in the Comparative Example.

Figure 6B:
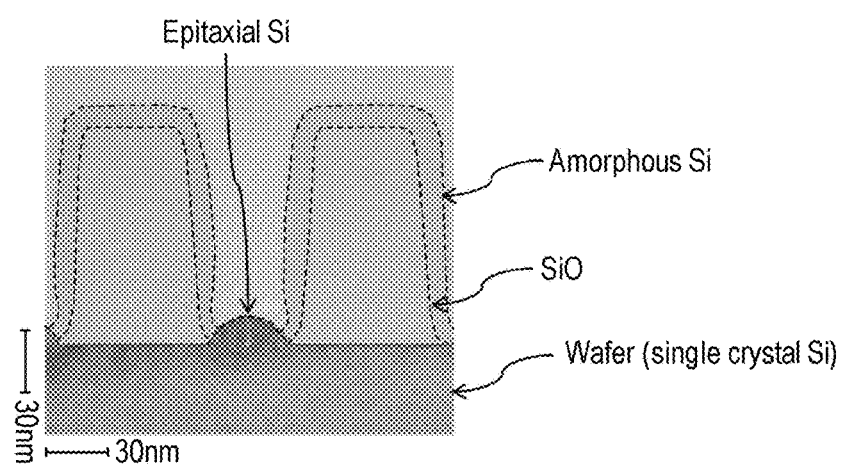
FIG. 6B is a view showing a cross-sectional enlarged photograph of the surface of a wafer in Reference Example.
Figure 6C:
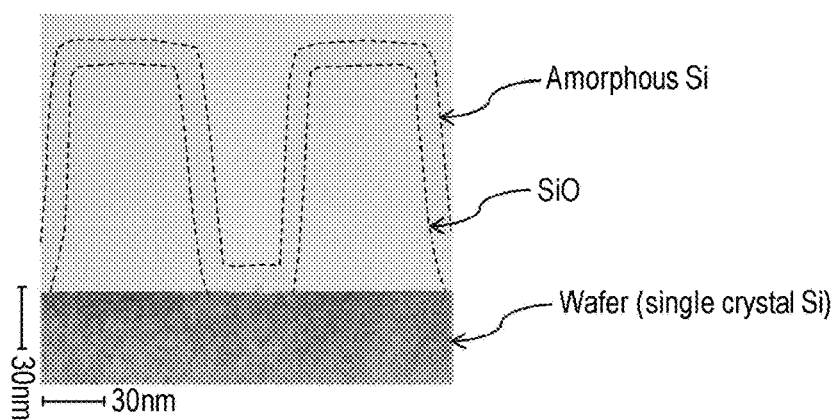
FIG. 6C is a view showing a cross-sectional enlarged photograph of the surface of a wafer in Comparative Example.

From comparison between FIG. 6A and FIG. 6C, it can be seen in the Comparative Example that no epitaxial Si film is grown on the bottom of the concave portion. On the other hand, it can be seen in the Embodiment Example that the epitaxial Si film is continuously formed at the bottom of the concave portion. That is, it is understood that it is possible to form a high quality Si film, that is, a Si film having a laminated structure of an epitaxial Si film and an amorphous Si film, on the wafer by performing the pre-etching step before the first film forming step.

From comparison between FIG. 6A and FIG. 6B, it can be seen that the epitaxial Si film formed in the Embodiment Example is not only a continuous film but also has the same film thickness distribution as the epitaxial Si film formed in the Reference Example. That is, it is understood that it is possible to form a Si film having the same quality as the case of forming the seed layer before the first film forming step on the wafer by performing the pre-etching step before the first film forming step. In addition, in the Embodiment Example, the preparation time period (the time period required for the pre-etching step) before initiating the first film forming step is approximately 10 minutes, whereas, in the Reference Example, the preparation time period (the total time period required for the seed layer forming step and the temperature raising step) before initiating the first film forming step is approximately 80 minutes. It can be seen from this that the productivity of the substrate processing can be significantly improved over the case where the seed layer is formed before the first film forming step, by performing the pre-etching step before the first film forming step.

According to the present disclosure in some embodiments, it is possible to improve the productivity of a process of forming a silicon film on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    (a) pre-etching a surface of a substrate made of single crystal silicon by supplying a first etching gas to the substrate;
    (b) forming a silicon film on the substrate with the pre-etched surface, by supplying a first silicon-containing gas to the substrate;
    (c) etching a portion of the silicon film by supplying a second etching gas, which has a different molecular structure from a molecular structure of the first etching gas, to the substrate; and
    (d) forming an additional silicon film on the etched silicon film by supplying a second silicon-containing gas to the substrate.

2. The method according to claim 1, wherein each of the first etching gas and the second etching gas contains one or more halogen atoms, and a number of the one or more halogen atoms contained in one molecule of the first etching gas is larger than a number of the one or more halogen atoms contained in one molecule of the second etching gas.

3. The method according to claim 1, wherein the first etching gas contains one or more halogen atoms and does not contain a non-halogen atom, and the second etching gas contains one or more halogen atoms and one or more non-halogen atoms.

4. The method according to claim 1, wherein the first etching gas has higher reactivity than the second etching gas.

5. The method according to claim 1, wherein the first etching gas includes chlorine gas, and the second etching gas includes hydrogen chloride gas.

6. The method according to claim 1, wherein (a), (b), (c) and (d) are carried out in the same process chamber.

7. The method according to claim 1, wherein (a), (b), (c) and (d) are carried out under the same temperature condition.

8. The method according to claim 1, wherein (a), (b), (c) and (d) are carried out under a temperature condition that is equal to or higher than 450 degrees C. and equal to or lower than 550 degrees C.

9. The method according to claim 1, wherein (a), (b), (c) and (d) are carried out under a temperature condition at or below crystallization temperature of silicon.

10. The method according to claim 1, wherein a pressure in a space where the substrate is present in (c) is set to be larger than a pressure in a space where the substrate is present in (a).

11. The method according to claim 1, wherein the silicon film formed in (b) is a silicon film doped with a dopant.

12. The method according to claim 1, wherein in (b), a dopant gas is supplied to the substrate together with the first silicon-containing gas.

13. The method according to claim 1, wherein the additional silicon film formed in (d) is a silicon film doped with a dopant.

14. The method according to claim 1, wherein in (d), a dopant gas is supplied to the substrate together with the second silicon-containing gas.

15. The method according to claim 1, wherein the single crystal silicon and an insulating film are exposed on the surface of the substrate, and
wherein in (b), a homoepitaxial silicon film is grown on the single crystal silicon, and an amorphous silicon film, a polysilicon film or a mixed crystal silicon film of amorphous silicon and polysilicon is grown on the insulating film.

16. The method according to claim 15, wherein a concave portion is formed on the surface of the substrate, a bottom part of the concave portion is made of the single crystal silicon, and a side part of the concave portion is made of the insulating film, and
wherein a growth of the homoepitaxial silicon film is stopped by coveting a top part of the homoepitaxial silicon film grown from the bottom part of the concave portion with the amorphous silicon film, the polysilicon film or the mixed crystal silicon film of amorphous silicon and poly silicon grown from the side part of the concave portion.

17. The method according to claim 16, wherein a laminated structure including the amorphous silicon film, the polysilicon film or the mixed crystal silicon film of amorphous silicon and polysilicon laminated on the homoepitaxial silicon film is formed in the concave portion.

18. The method according to claim 16, wherein the homoepitaxial silicon film is formed at an interface between the single crystal silicon and the amorphous silicon film, the polysilicon film or the mixed crystal silicon film of amorphous silicon and polysilicon.

19. A substrate processing apparatus comprising:
a process chamber in which a substrate is processed;
a first supply system configured to supply a first etching gas to the substrate in the process chamber;
a second supply system configured to supply a second etching gas, which has a different molecular structure from a molecular structure of the first etching gas, to the substrate in the process chamber;
a third supply system configured to supply a first silicon-containing gas and a second silicon-containing gas to the substrate in the process chamber; and
a controller configured to control the first supply system, the second supply system and the third supply system to perform a process in the process chamber, the process including:
(a) pre-etching a surface of a substrate made of single crystal silicon by supplying the first etching gas to the substrate;
(b) forming a silicon film on the substrate with the pre-etched surface, by supplying the first silicon-containing gas to the substrate;
(c) etching a portion of the silicon film by supplying the second etching gas to the substrate; and
(d) forming an additional silicon film on the etched silicon film by supplying the second silicon-containing gas to the substrate.

20. A non-transitory computer-readable recording medium storing a program that causes a computer to perform a process in a process chamber of a substrate processing apparatus, the process comprising:
(a) pre-etching a surface of a substrate made of single crystal silicon by supplying a first etching gas to the substrate;
(b) forming a silicon film on the substrate with e pre-etched surface, by supplying a first silicon-containing gas to the substrate;
(c) etching a portion of the silicon film by supplying a second etching gas, which has a different molecular structure from a molecular structure of the first etching gas, to the substrate; and
(d) forming an additional silicon film on the etched silicon film by supplying a second silicon-containing gas to the substrate.

* * * * *